United States Patent
Lee

(10) Patent No.: US 10,529,427 B2
(45) Date of Patent: Jan. 7, 2020

(54) MEMORY SYSTEM AND OPERATION METHOD WITH PARTIAL MEMORY BLOCK DETECTOR

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/037,661

(22) Filed: Jul. 17, 2018

(65) Prior Publication Data

US 2019/0198116 A1    Jun. 27, 2019

(30) Foreign Application Priority Data

Dec. 21, 2017   (KR) .................. 10-2017-0177245

(51) Int. Cl.
*G11C 16/10* (2006.01)
*G11C 16/04* (2006.01)
*G06F 12/02* (2006.01)

(52) U.S. Cl.
CPC .......... *G11C 16/10* (2013.01); *G11C 16/0483* (2013.01); *G06F 12/0253* (2013.01)

(58) Field of Classification Search
CPC .. G11C 16/10; G11C 16/0483; G06F 12/0253
See application file for complete search history.

(56) References Cited

U.S. PATENT DOCUMENTS

| 6,581,142 B1* | 6/2003 | Jacobs | G06F 12/10 711/159 |
| 6,829,689 B1* | 12/2004 | Van Dyke | G06F 13/1605 711/103 |
| 10,296,243 B2* | 5/2019 | Kim | G06F 3/0619 |
| 2015/0332770 A1* | 11/2015 | Kim | G11C 16/10 365/238.5 |
| 2018/0143876 A1* | 5/2018 | Yang | G11C 11/5628 |

FOREIGN PATENT DOCUMENTS

| KR | 1020150047394 | 5/2015 |
| KR | 1020150130638 | 11/2015 |
| KR | 1020160044989 | 4/2016 |

* cited by examiner

*Primary Examiner* — Son T Dinh
*Assistant Examiner* — Sultana Begum
(74) *Attorney, Agent, or Firm* — IP & T Group LLP

(57) ABSTRACT

A semiconductor memory system includes a memory device including a plurality of memory blocks; a partial memory block detector suitable for detecting at least one partial memory block among the plurality of memory blocks; an open page detector suitable for detecting addresses and a number of a plurality of open pages among a plurality of pages included in the partial memory block; and a controller suitable for controlling the memory device to perform a one-shot program operation with dummy data according to the addresses and the number of the plurality of open pages.

20 Claims, 14 Drawing Sheets

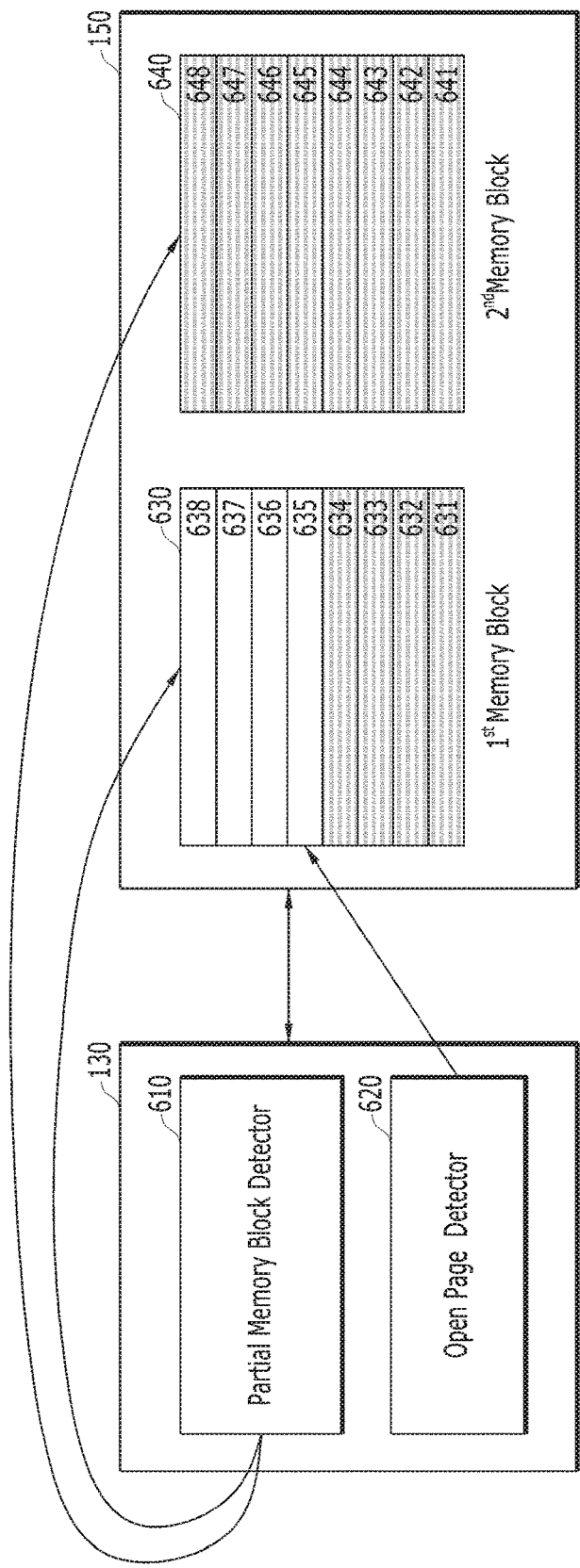

FIG. 6B

Partial Memory Block Management Table (610)

|  | Address | Flag |
|---|---|---|
| 1st Memory Block | a | 1 |
| 2nd Memory Block | b | 0 |

FIG. 6C

Open Page Management Table (620)

|  | 1st Memory Block |
|---|---|
| Address of 1st Open Page | c |
| Size of Page | d |
| Size of Memory Block | e |

FIG. 7B

Partial Memory Block Management Table (710, 715)

|  | Address | Flag |
|---|---|---|
| 1st Memory Block | a | 1 |
| 2nd Memory Block | b | 0 |
| 3rd Memory Block | c | 1 |
| 4th Memory Block | d | 0 |

FIG. 7C

Open Page Management Table (720, 725)

|  | 1st Memory Block | 3 Memory Block |
|---|---|---|
| Address of 1st Open Page | e | h |
| Size of Page | f | i |
| Size of Memory Block | g | j |

MEMORY SYSTEM AND OPERATION METHOD WITH PARTIAL MEMORY BLOCK DETECTOR

CROSS-REFERENCE TO RELATED APPLICATIONS

The present application claims priority under 35 U.S.C. § 119(a) to Korean Patent Application No. 10-2017-0177245, filed on Dec. 21, 2017, the disclosure of which is incorporated herein by reference in its entirety.

BACKGROUND

1. Field

Various exemplary embodiments of the invention generally relate to an electronic device. Particularly, the embodiments relate to a memory system capable of performing a one-shot dummy data program operation and an operating method thereof.

2. Description of the Related Art

The computer environment paradigm has moved to ubiquitous computing systems that support computing anytime and anywhere. The use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems may provide excellent stability, durability, high information access speed, and low power consumption because they have no moving parts (e.g., a mechanical arm with a read/write head) as compared with a hard disk device. Examples of memory systems having such advantages include universal serial bus (USB) memory devices, memory cards having various interfaces, and solid-state drives (SSD).

SUMMARY

Various embodiments of the present invention are directed to a memory system capable of performing a one-shot dummy data program operation. The memory system can detect a partial memory block and an open page of the partial memory block. Various embodiments of the present invention are also directed to an operating method of the memory system.

In accordance with an embodiment of the present invention, a semiconductor memory system may include a memory device including a plurality of memory blocks; a partial memory block detector suitable for detecting at least one partial memory block among the plurality of memory blocks; an open page detector suitable for detecting addresses and a number of a plurality of open pages among a plurality of pages included in the partial memory block; and a controller suitable for controlling the memory device to perform a one-shot program operation with dummy data according to the addresses and the number of the plurality of open pages.

The partial memory block detector may detect a memory block including the plurality of open pages as a partial memory block among the plurality of memory blocks.

The controller may control the memory device to perform the one-shot program operation with dummy data through a single one-shot program command.

The open page detector may generate an open page management table including information of a first open page among the plurality of open pages included in the partial memory block.

The open page management table may have information of: an address of the first open page; and a size of the first open page.

The open page detector may calculate the addresses and the number of the plurality of open pages based on the open page management table.

The controller may control the memory device to perform the one-shot program operation with dummy data to first to last one of the plurality of open pages.

The controller may manage, when the partial memory block detector detects a plurality of partial memory blocks among the plurality of memory blocks, the plurality of partial memory blocks as a super partial memory block.

The open page detector may detect addresses and a number of a plurality of open pages among a plurality of pages included in each of the plurality of partial memory blocks.

The controller may control the memory device to perform the one-shot program operation with dummy data to the super partial memory block.

In accordance with an embodiment of the present invention, an operating method of a semiconductor memory system including a memory device having a plurality of memory blocks and a controller, the method may include: a first step of detecting at least one partial memory block among the plurality of memory blocks; a second step of detecting addresses and a number of a plurality of open pages among a plurality of pages included in the partial memory block; and a third step of performing a one-shot program operation with dummy data according to the addresses and the number of the plurality of open pages.

The first step may detect a memory block including the plurality of open pages as a partial memory block among the plurality of memory blocks.

The third step may perform the one-shot program operation with dummy data through a single one-shot program command.

The second step may generate an open page management table including information of a first open page among the plurality of open pages included in the partial memory block.

The open page management table has information of: an address of the first open page; and a size of the first open page.

The second step may calculate the addresses and the number of the plurality of open pages based on the open page management table.

The third step may perform the one-shot program operation with dummy data to first to last one of the plurality of open pages.

The third step may manage, when the first step detects a plurality of partial memory blocks among the plurality of memory blocks, the plurality of partial memory blocks as a super partial memory block.

The second step may detect addresses and a number of a plurality of open pages among a plurality of pages included in each of the plurality of partial memory blocks.

The third step may perform the one-shot program operation with dummy data to the super partial memory block.

In accordance with an embodiment of the present invention, a semiconductor memory system may include: a memory device including a plurality of memory dies, each memory die including a plurality of memory blocks and each memory block including a plurality of memory pages; and a controller suitable for performing a program operation on a per-memory die basis with a one-shot dummy data program operation on a per-memory block basis, wherein the program operation includes plural sub-program operations, each corresponding to each of plural program commands, each supplied into each memory page, while the one-shot dummy data program operation include a single sub-program operation corresponding to a single program commands with plural dummy data of which amount is determined by a number of open pages.

BRIEF DESCRIPTION OF THE DRAWINGS

FIG. 6A is a diagram illustrating a memory system capable of performing a one-shot dummy data program operation.

FIG. 6B is a diagram illustrating a partial memory block management table in accordance with an embodiment of the present invention.

FIG. 6C is a diagram illustrating an open page management table in accordance with an embodiment of the present invention.

FIG. 7B is a diagram illustrating a partial memory block management table in accordance with an embodiment of the present invention.

FIG. 7C is a diagram illustrating an open page management table in accordance with an embodiment of the present invention

DETAILED DESCRIPTION

Figure 1:
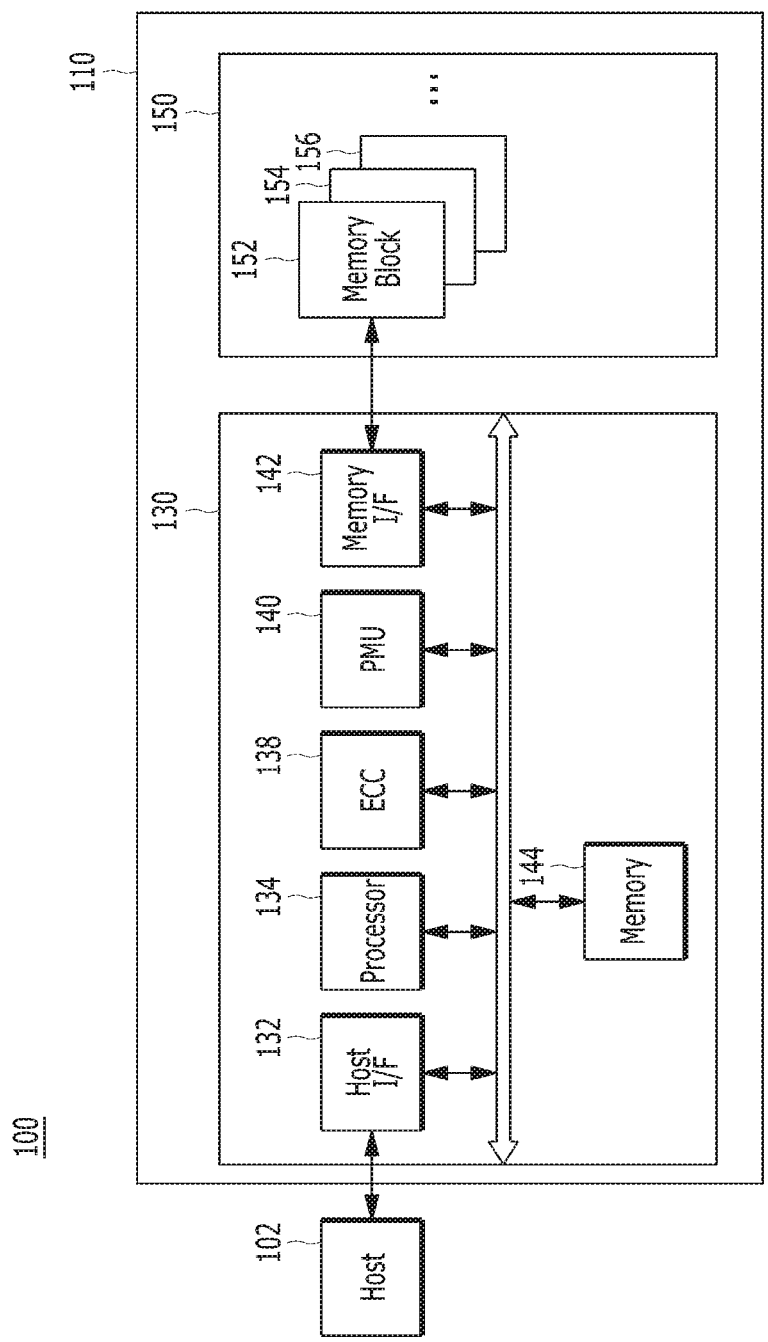
FIG. 1 is a block diagram illustrating a data processing system including a memory system, in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the disclosure of the present invention. It will be further understood that terms, such as those defined in commonly used dictionaries, should be interpreted as having a meaning that is consistent with their meaning in the context of the disclosure and the relevant art and will not be interpreted in an idealized or overly formal sense unless expressly so defined herein.

In the following description, numerous specific details are set forth to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a simplified block diagram illustrating a data processing system 100, in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player, and a laptop computer or an electronic device such as a desktop computer, a game player, a TV, a projector, and the like.

The memory system 110 may operate in response to a request from the host 102. Particularly, the memory system 110 may store data inputted or accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of suitable storage devices include a solid-state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM) and a flash memory.

The memory system 110 may include a memory device 150 for storing data to be accessed by the host 102, and a controller 130 for controlling storage of data in the memory device 150.

The controller 130 and the memory device 150 may be integrated into a single semiconductor device, for example into one of the various types of memory systems exemplified above.

The memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may be a nonvolatile memory device capable of retaining data stored therein even when power is not supplied to the memory device. The memory device 150 may store data entered from the host 102 through a write operation, and provide data stored therein to the host 102 through a read operation. The memory device 150 may include a plurality of memory blocks 152 to 156, each of the memory blocks 152 to 156 may include a plurality of pages.

Each of the pages may include a plurality of memory cells to which a plurality of word lines WL are electrically coupled.

The controller 130 may control overall operations of the memory device 150, such as read, write, program, and erase operations. For example, the controller 130 of the memory system 110 may control the memory device 150 in response to a request from the host 102. The controller 130 may provide the data read from the memory device 150, to the host 102, and/or may store the data provided from the host 102 into the memory device 150.

The controller 130 may include a host interface (I/F) unit 132, a processor 134, an error correction code (ECC) unit 138, a power management unit (PMU) 140, a memory interface I/F unit 142 such as a NAND flash controller (NFC), and a memory 144, all operatively coupled via an internal bus.

The host interface unit 132 may process commands and data provided from the host 102. The host interface unit 134 may communicate with the host 102 under at least one of various interface protocols such as universal serial bus (USB), multimedia card (MMC), peripheral component interconnect-express (PCI-E), small computer system interface (SCSI), serial-attached SCSI (SAS), serial advanced technology attachment (SATA), parallel advanced technology attachment (DATA), small computer system interface (SCSI), enhanced small disk interface (ESDI) and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low-density parity check (LDDC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, modules, systems, or devices for the error correction operation.

The PMU 140 may provide and manage power of the controller 130.

The memory interface unit 142 may serve as a memory/storage interface between the controller 130 and the memory device 150 to allow the controller 130 to control the memory device 150 in response to a request from the host 102. The memory interface unit 142 may generate a control signal for the memory device 150 and process data to be provided to the memory device 150 under the control of the processor 134 when the memory device 150 is a flash memory and, in particular, the memory device 150 is a NAND flash memory. It is noted that the invention is not limited to NAND flash memory/NAND flash interface, and that a suitable memory/storage interface may be selected depending upon the type of the memory device 150.

The memory 144 may serve as a working memory of the memory system 110 and the controller 130, and store data for driving the memory system 110 and the controller 130. The controller 130 may control the memory device 150 in response to a request from the host 102. The controller 130 may provide data read from the memory device 150 to the host 102, while storing data provided from the host 102 into the memory device 150. The memory 144 may store data required for the controller 130 and the memory device 150 to perform these operations.

The memory 144 may be implemented with a volatile memory. The memory 144 may be implemented with a static random access memory (SRAM) or a dynamic random access memory (DRAM). Although FIG. 1 shows the memory 144 inside controller 130, it is for illustrative purposes only, and the disclosure is not limited thereto. That is, the memory 144 may be disposed within or out of the controller 130. In another embodiment, the memory 144 may be embodied by an external volatile memory having a memory interface transferring data between the memory 144 and the controller 130.

The processor 134 may control the overall operations of the memory system 110. The processor 134 may use a firmware, which is referred to as a flash translation layer (FTL), to control general operations of the memory system 110.

The FTL may perform an operation as an interface between the host 102 and the memory device 150. The host 102 may request to the memory device 150 write and read operations through the FTL.

The FTL may manage operations of address mapping, garbage collection, wear-leveling, and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, when the controller 130 updates data of a particular page, the controller 130 may perform the address mapping operation based on the map data to program new data into another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134, and may perform bad block management of the memory device 150. The management unit may find bad memory blocks included in the memory device 150, which are in unsatisfactory condition for further use. The management unit may perform bad block management on the bad memory blocks. When the memory device 150 is a flash memory such as a NAND flash memory, a program failure may occur during the write operation (i.e., during the program operation), due to characteristics of a NAND logic function. During the bad block management, the data of the program-faded memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is needed.

Figure 2:
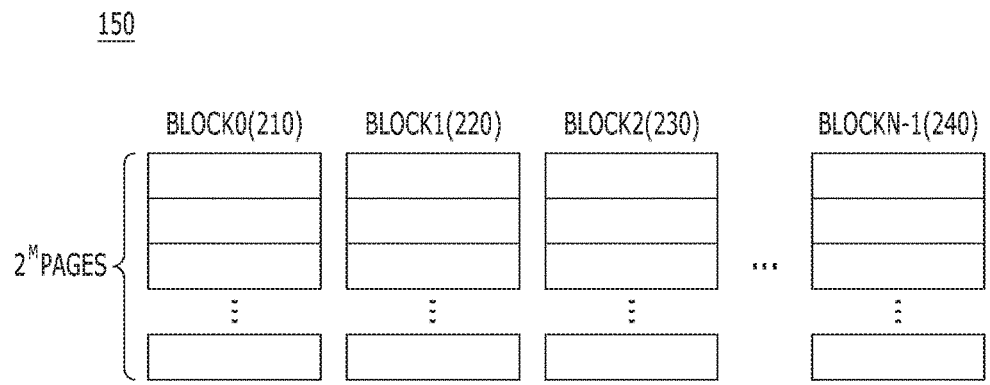
FIG. 2 is a schematic diagram illustrating an exemplary configuration of a memory device employed in the memory system shown in FIG. 1.

FIG. 2 is a schematic diagram illustrating the memory device 150 of FIG. 1.

Referring to FIG. 2, the memory device 150 may include the plurality of memory blocks BLOCK 0 to BLOCKN-1. Here, N is an integer larger than 1. Each of the blocks BLOCK 0 to BLOCKN-1 may include a plurality of pages, for example, $2^M$ pages, the number of which may vary according to circuit design. Here, M is an integer larger than 1. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells, each capable of storing 3-bit data may be referred to as a triple level cell (TLC) memory block.

Each of the plurality of memory blocks 210 to 240 may store the data provided from the host device 102 during a write operation, and may provide stored data to the host 102 during a read operation.

Figure 3:
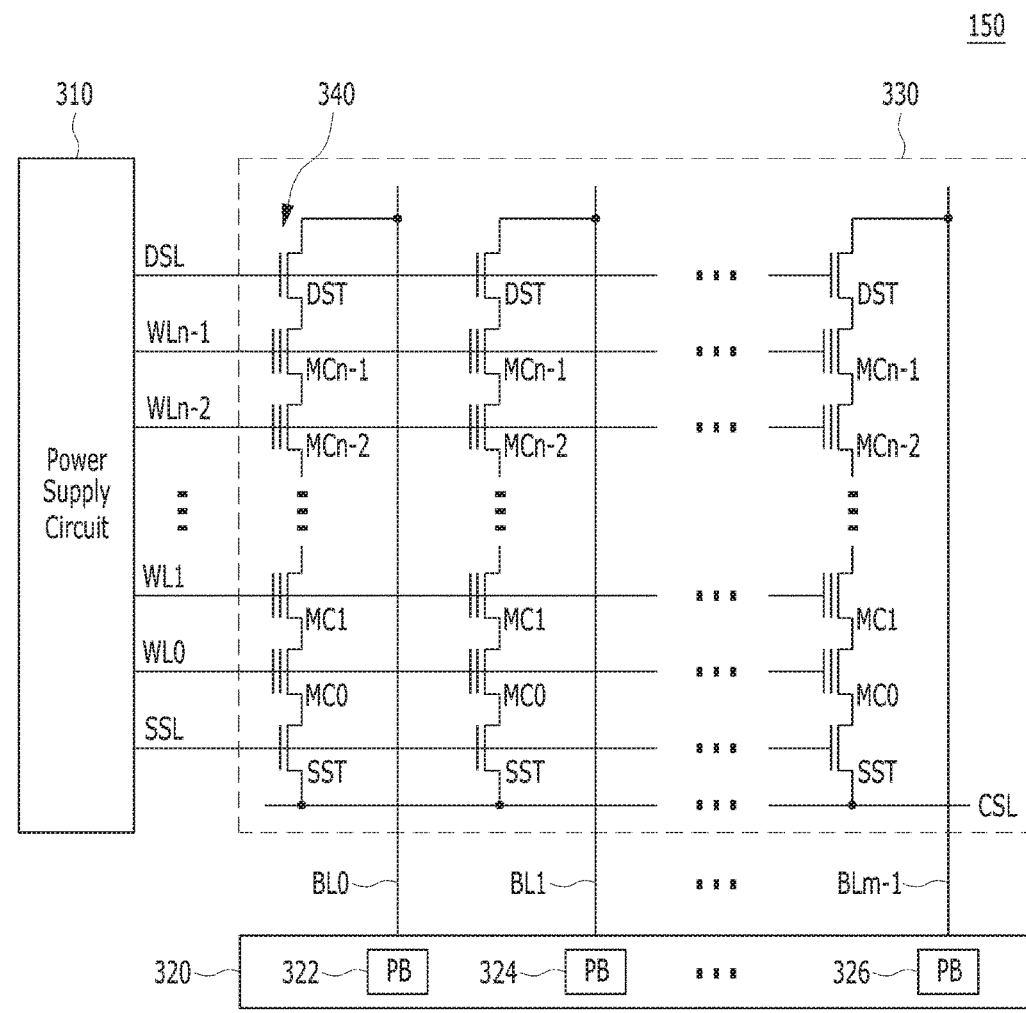
FIG. 3 is a circuit diagram illustrating an exemplary configuration of a memory cell array of a memory block in the memory device shown in FIG. 2.

FIG. 3 is a circuit diagram illustrating a memory cell array 330 in the memory device 150 of FIGS. 1 and 2.

Referring to FIG. 3, the memory cell array 330 may correspond to any of the plurality of memory blocks 152 to 156 shown in FIG. 1.

Referring to FIG. 3, the memory cell array 330 of the memory device 150 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST, SST. The respective memory cells MC0 to MCn-1 may be configured by single level cells (SLC), each storing 1-bit information, or by multi-level cells (MLC), each storing multi-bit information. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 only shows, as an example, the memory cell array 330 which is configured by NAND flash memory cells, it is to be noted that the memory cell array 330 of the memory device 150 in accordance with the embodiment is not limited to NAND flash memory. In accordance with embodiments, the memory cell array 330 may be implemented with NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may generate different word line voltages, for example, a program voltage, a read voltage and a pass voltage, to supply one of them to respective word lines according to an operation mode. The word line voltage may be determined based at least on voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select at least one of the memory blocks or sectors of a memory cell array under the control of the control circuit, select at least one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification or normal read operation, the read/write circuit 320 may operate as a sense amplifier for reading data from the memory cell array. During a program operation, the read/write circuit 320 may work as a write driver for supplying a voltage or a current into bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
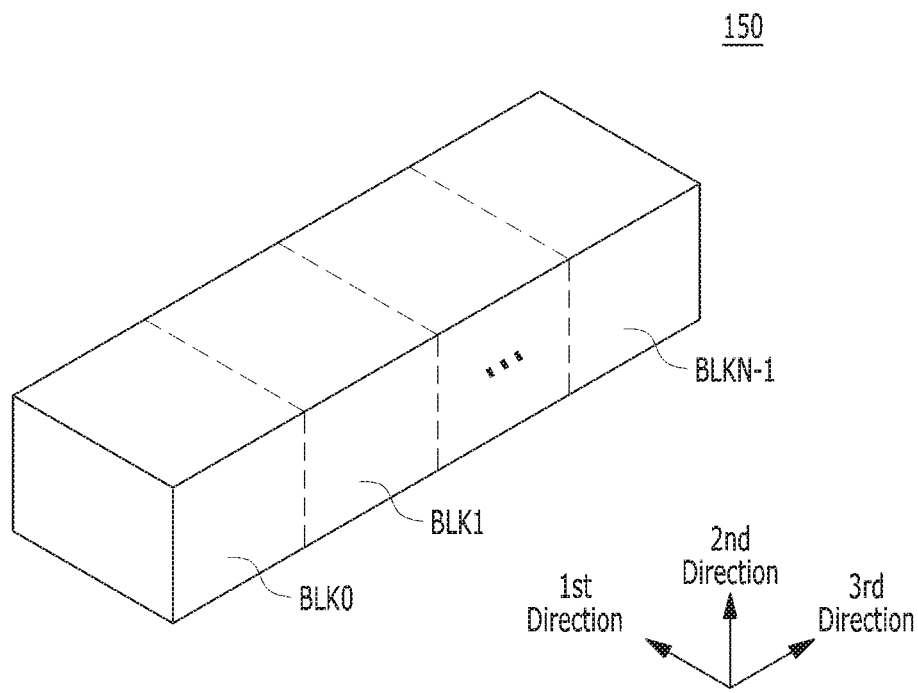
FIG. 4 is a schematic diagram illustrating an exemplary three-dimensional structure of the memory device shown in FIG. 2.

FIG. 4 is a schematic diagram illustrating a three-dimensional (3D) structure of the memory device 150 of FIGS. 1 and 2.

The memory device 150 may be embodied by a two-dimensional (2D) or a three-dimensional (3D) memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1, each having a 3D structure (or vertical structure).

Figure 5:
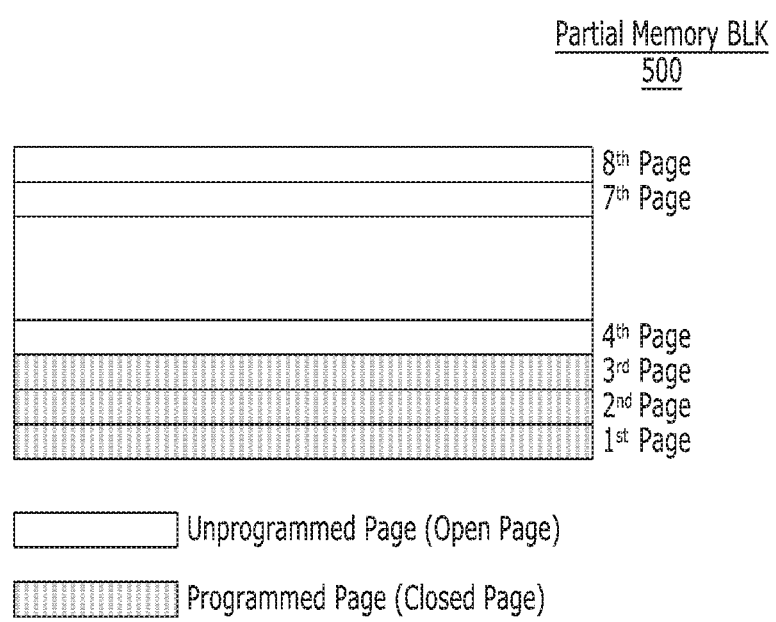
FIG. 5 is a simplified block diagram illustrating a partial memory block 500 in accordance with an embodiment of the present invention.

FIG. 5 is a block diagram illustrating a partial memory block 500.

In a partial memory block, not all pages but only some pages are programmed with data since an ongoing program operation to the memory block is suddenly interrupted due to an unintended reason such as a sudden power off and so forth.

As illustrated in FIG. 5, a memory block may comprise eight (8) pages in total, which is merely an example for illustration purposes only. Embodiments of the invention will not be restricted to any particular number of pages included in a memory block. The number of pages in each memory block may be changed by design.

The partial memory block 500 may be one of the memory blocks 142, 154, 156 included in the memory device 150 described with reference to FIGS. 1 to 4.

In the illustrated example of FIG. 5, the partial memory block 500 may include three (3) closed pages and five (5) open pages.

A closed page is a page which has been programmed. An open page is a page which has not being programmed as of yet or a program operation is not completed as of yet. For example, an open page may include a page which was being programmed when due to a sudden event the programming was interrupted and was not completed.

As illustrated in FIG. 5, during a program operation to the pages of the memory block 500 was interrupted due to an SPO. Specifically, the programming was interrupted when page four was being programmed. Hence, the partial memory block 500 includes first to third pages as closed pages, i.e., pages to which a program operation is completed, and fourth to eighth pages as open pages for which a program operation is interrupted or not started.

Therefore, in the partial memory block 500 of FIG. 5, a program operation to first to third pages is completed while a program operation to fourth to eighth pages is interrupted or not started.

Therefore, the partial memory block 500 may be considered an open memory block, in which a program operation to part of pages is completed and a program operation to remaining pages is not completed yet.

The partial memory block 500 may have low reliability and stability since it has open pages for which a program operation is interrupted or not completed yet.

To improve the reliability and stability of the partial memory block 500, a program operation of programming dummy data into the open pages in the partial memory block 500 may be performed. To program dummy data into the open pages, the controller 130 may individually generate a program command for each of the open pages in the partial memory block 500, and control the memory device 150 to individually perform the program operation to each of the open pages.

In detail, in the example of FIG. 5, the controller 130 should generate a program command for each of the five (5) pages (i.e., the fourth to eighth pages). Further, the controller 130 should control the memory device 150 to perform a program operation in response to each of the five program commands corresponding to the five pages.

Such individual generation of a program command and such individual program operation for programming dummy data into the open pages may cause degradation of the overall performance of the memory system.

In accordance with an embodiment of the present invention, the aforementioned limitation of existing memory systems is addressed by first calculating a necessary amount and pattern of dummy data to be programmed into a partial memory block and then generating a single program command for programming dummy data into the open pages of the partial memory block in response to the single command. Hence, in accordance with the present invention memory system, a single command is sufficient for programming dummy data into the open pages of a partial memory block.

FIG. 6A is a diagram illustrating a memory system capable of performing a one-shot dummy data program operation.

The controller 130 may include a partial memory block detector 610 and an open page detector 620.

The partial memory block detector 610 may detect a partial memory block among a plurality of memory blocks included in the memory device 150. For example, the partial memory block detector 610 may detect a first memory block 630 as a partial memory block. Further, the partial memory block detector 610 may determine that a second memory block 640 is not a partial memory block.

The partial memory block detector 610 may keep information of the partial memory block detection. For example, the partial memory block detector 610 may keep the information of the partial memory block detection in a table. Also, the information of the partial memory block detection may manage the information of the partial memory block detection through a hardware component or a software component.

The information of the partial memory block detection may include logical and physical addresses of the detected partial memory block. Also, the information of the partial memory block detection may include a flag indicating whether a corresponding memory blocks is a partial memory block.

FIG. 6B is a diagram illustrating a partial memory block management table 615 included in the partial memory block detector 610.

The partial memory block detector 610 may detect as a partial memory block one among a plurality of memory blocks 630 and 640 included in the memory device 150, and may manage the information of the partial memory block detection through the partial memory block management table 615.

The partial memory block management table 615 may have the information of the partial memory block detection as described above.

In detail, the partial memory block management table 615 may have addresses of the plurality of memory blocks 630, 640 included in the memory device 150 and corresponding partial memory block flags.

When a partial memory block flag has a value of logic high, a memory block corresponding to the partial memory block flag may be managed as a partial memory block.

When a partial memory block flag has a value of logic low, a memory block corresponding to the partial memory block flag may be managed not as a partial memory block but as a normal memory block.

As exemplified in FIG. 6B, since the first memory block 630 is detected as a partial memory block, a partial memory block flag of the first memory block 630 may have a value of high logic so that the first memory block 630 may be managed as a partial memory block.

Also, since the second memory block 640 is not detected as a partial memory block, a partial memory block flag of the second memory block 640 may have a value of low logic so that the second memory block 640 may be managed as a normal memory block.

Referring back to FIG. 6A, the open page detector 620 may detect open pages of the partial memory block.

In detail, the open page detector 620 may detect a first open page among a plurality of open pages in the first memory block 630 detected as a partial memory block.

For example, the first memory block 630 may include first to fourth pages 631 to 634 as closed pages and fifth to eighth pages 635 to 638 as open pages.

That is, a program operation is completed to the first to fourth pages 631 to 634 while a program operation is interrupted or not completed to the fifth to eighth pages 635 to 638.

The open page detector 620 may detect the fifth to eighth pages 635 to 638 as open pages by just detecting the fifth page 635, which is a first one among the open pages (e.g., the fifth to eighth pages 635 to 638), and by calculating addresses and a number of remaining open pages (e.g., the sixth to eighth pages 636 to 638) based on the detected fifth page 635 in the partial memory block. The open page detector 620 does not have to individually detect each of the fifth to eighth pages 635 to 638 as the open pages.

FIG. 6C is a diagram illustrating the open page management table 625 included in the open page detector 620.

The open page detector 620 may detect just first one among open pages (e.g., the fifth page 635 among the fifth to eighth pages 635 to 638) in the first memory block 630 detected as a partial memory block. The open page detector 620 may identify the remaining open pages (e.g., the sixth to eighth pages 636 to 638) in the first memory block 630 detected as the partial memory block according to known information.

This is because the plurality of memory blocks 630, 640 have the same size as one another and the addresses are sequentially allocated to the plurality of memory blocks 630, 640 according to a predetermined rule. For example, when the fifth page 635 that is the first one among the open pages has a size of "d", each of the remaining open pages may also have the size of "d".

Also, when the fifth page 635 that is the first one among the open pages has an address of "c", the sixth page 636 that is the second one among the open pages has an address of "c+1" and the eighth page 638 that is the last one among the open pages has an address of "c+3".

If a number of pages included in a memory block is not known, the number of pages in the memory block may be obtained by dividing a size "e" of the memory block by a size "d" of a page. Therefore, the open page detector 620 may identify the addresses of the first to last open pages (e.g., the fifth to eighth pages 635 to 638) in a partial memory block.

The open page detector 620 may identify the logical and physical addresses of the fifth page 635 detected as the first open page in the first memory block 630 detected as the partial memory block. Also, the open page detector 620 may detect the remaining open pages (e.g., the sixth to eighth pages 636 to 638) in the first memory block 630 according to a number of pages and the logical and physical addresses of the pages of the first memory block 630.

In detail, the open page detector 620 may generate an open page management table having information of the fifth page 635 detected as the first open page among the plurality of open pages (e.g., the fifth to eighth pages 635 to 638) included in the first memory block 630 detected as the partial memory block.

The open page management table may have information of the address and the size of the fifth page 635 detected as the first open page and the size of the first memory block 630 detected as the partial memory block including the fifth page 635 detected as the first open page.

The open page detector 620 may identify a number and addresses of the remaining open pages (e.g., the sixth to eighth pages 636 to 638) in the first memory block 630 detected as the partial memory block according to the information in the open page management table.

The open page detector 620 may identify information of the fifth page 635 detected as the first open page in the first memory block 630 detected as the partial memory block from the open page management table. The open page detector 620 may identify the remaining open pages (e.g., the sixth to eighth pages 636 to 638) in the first memory block 630 detected as the partial memory block according to the number and logical and physical addresses of pages in the first memory block 630 detected as the partial memory block.

The above description is merely an example of various schemes for identifying all of a plurality of open pages included in a partial memory block by just detecting a first one among the plurality of open pages. The open page detector 620 may identify all of a plurality of open pages included in a partial memory block according to a scheme appropriate to implementation of a memory system.

Referring back to FIG. 6A, the controller 130 may generate one or more dummy data program commands as many as the number of open pages according to the operations of the partial memory block detector 610 and the open page detector 620. In an embodiment, the host 102 may generate such dummy data program commands and provide them to the controller 130. The invention may cover both of the above described embodiments.

The dummy data program commands may be implemented as a single one-shot program command.

The controller 130 may control the memory device 150 to perform a one-shot program operation with dummy data in response to a single one-shot program command. That is, the controller 130 may control the memory device 150 to perform a one-shot program operation with dummy data to the first to last open pages (e.g., the fifth to eighth pages 635 to 638) in the first memory block 630, detected as a partial memory block, in response to a single one-shot program command.

As described above, operation performance of a memory system may be improved by minimizing process required to identify an amount of dummy data to be programmed and by performing a one-shot program operation with dummy data.

Figure 7A:
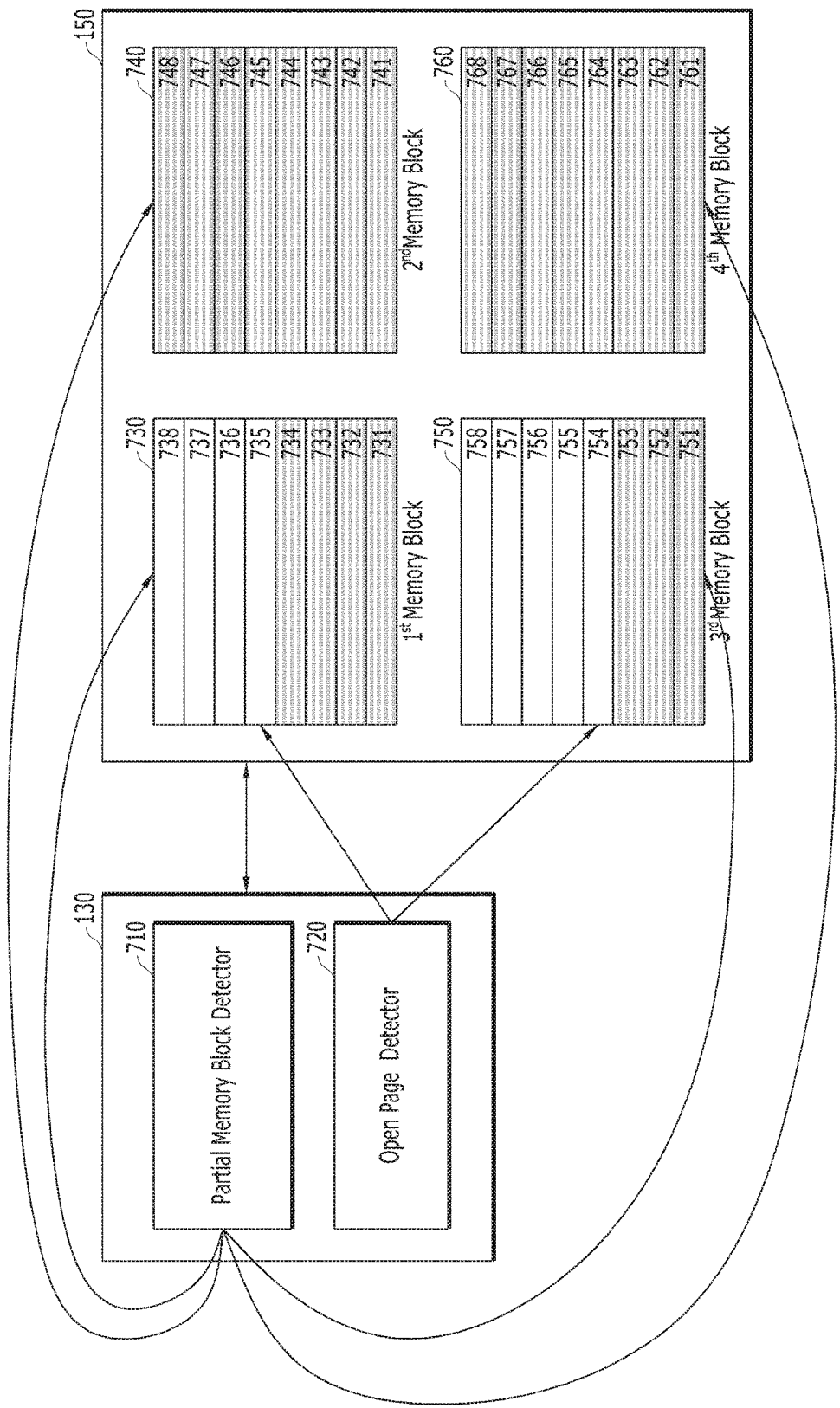
FIG. 7A is a diagram illustrating an exemplary test read table included in a test read management unit in accordance with an embodiment of the present invention.

FIG. 7A is a diagram illustrating a case where the memory device 150 includes a plurality of partial memory blocks.

The partial memory block detector 710 may detect partial memory blocks among a plurality of partial memory blocks included in the memory device 150.

As illustrated in FIG. 7A, the partial memory block detector 710 may detect a first memory block 730 and a third memory block 750 as partial memory blocks.

As such, when the memory device 150 includes the first memory block 730 and the third memory block 750 as the plurality of partial memory blocks, the controller 130 may manage the plurality of partial memory blocks 730, 750 as a super partial memory block.

FIG. 7B is a diagram illustrating the partial memory block management table 715 included in the partial memory block detector 710.

The partial memory block detector 710 may detect a partial memory block among a plurality of memory blocks 730, 740, 750, 760 included in the memory device 150. The partial memory block detector 710 may manage information of the detected partial memory block through the partial memory block management table 715.

The partial memory block management table 715 may have the information of the partial memory block detection as described above.

In detail, the partial memory block management table 715 may have addresses of the plurality of memory blocks 730, 740, 750, 760 included in the memory device 150 and corresponding partial memory block flags.

When a partial memory block flag has a value of logic high, a memory block corresponding to the partial memory block flag may be managed as a partial memory block.

When a partial memory block flag has a value of logic low, a memory block corresponding to the partial memory block flag may be managed as a normal memory block, not a partial memory block.

As exemplified in FIG. 7B, since the first memory block 730 and the third memory block 750 are detected as partial memory blocks, the partial memory block flags of the first memory block 730 and the third memory block 750 may have a value of high logic so that the first memory block 730 and the third memory block 750 may be managed as partial memory blocks.

Also, since each of the second memory block 740 and the fourth memory block 760 is not detected as a partial memory block, partial memory block flags of the second memory block 740 and the fourth memory block 760 may have a value of low logic so that the second memory block 740 and the fourth memory block 760 may be managed as normal memory blocks.

Referring back to FIG. 7A, the open page detector 720 may detect an open page of the respective first and third memory blocks 730 and 750 as partial memory blocks.

In detail, the open page detector 720 may detect the fifth page 735 as a first open page in the first memory block 730 detected as a partial memory block. Also, the open page detector 720 may detect the fourth page 754 as a first open page in the third memory block 750 detected as a partial memory block.

FIG. 7C is a diagram illustrating the open page management table 725 included in the open page detector 720.

As described above, the open page detector 720 may generate the open page management table corresponding to the fifth page 735 detected as a first open page of the first memory block 730 detected as a partial memory block and the open page management table corresponding to the fourth page 754 detected as a first open page of the third memory block 750 detected as a partial memory block.

Based on the open page management table, the open page detector 720 may identify information of the first one among open pages (e.g., the fifth page 735 among the fifth to eighth pages 735 to 738) in the first memory block 730 detected as a partial memory block, and may identify the remaining open pages (e.g., the sixth to eighth pages 736 to 738) in the first memory block 730 detected as a partial memory block according to the number and addresses of pages included in the first memory block 730 detected as a partial memory block.

In similar way, based on the open page management table, the open page detector 720 may identify information of the first one among open pages (e.g., the fourth page 754 among the fourth to eighth pages 754 to 758) in the third memory block 750 detected as a partial memory block, and may identify the remaining open pages (e.g., the fifth to eighth pages 755 to 758) in the third memory block 750 detected as a partial memory block according to the number and addresses of pages included in the third memory block 750 detected as a partial memory block.

The controller 130 may generate one or more dummy data program commands as many as the number of open pages according to the operations of the partial memory block detector 710 and the open page detector 720. In an embodiment, the host 102 may generate such dummy data program commands and provide them to the controller 130. The present invention may cover both of the above described embodiments.

The dummy data program commands may be implemented as a single one-shot program command.

The controller 130 may control the memory device 150 to perform a one-shot program operation with dummy data in response to a single one-shot program command. That is, the controller 130 may control the memory device 150 to perform a one-shot program operation with dummy data to the first to last open pages (e.g., the fifth to eighth pages 735 to 738) in the first memory block 730 detected as a partial memory block in response to a single one-shot program command. In similar way, the controller 130 may control the memory device 150 to perform a one-shot program operation with dummy data to the first to last open pages (e.g., the fourth to eighth pages 754 to 758) in the third memory block 750 detected as a partial memory block in response to a single one-shot program command.

Also, as described above, the controller 130 may manage the plurality of partial memory blocks 730, 750 as a super partial memory block. The controller 130 may control the memory device 150 to perform a one-shot program operation with dummy data to the super partial memory block in response to a single one-shot program command.

In detail, the controller 130 may control the memory device 150 to perform a one-shot program operation with dummy data to the first to last open pages (e.g., the fifth to eighth pages 735 to 738) of the first memory block 730 detected as a partial memory block and the first to last open pages (e.g., the fourth to eighth pages 754 to 758) of the third memory block 750 detected as a partial memory block in response to a single one-shot program command.

As such, in accordance with an embodiment of the invention, the controller 130 may manage a plurality of partial memory blocks as a super memory block, and thus may control the memory device 150 to perform a one-shop program operation with dummy data to the plurality of partial memory blocks.

In an embodiment, the controller 130 may control the memory device 150 to individually perform a one-shot program operation with dummy data to each of the plurality of partial memory blocks.

As described above, operation performance of a memory system may be improved by minimizing process required to identify an amount of dummy data to be programmed and by performing a one-shot program operation with dummy data.

Figure 8:
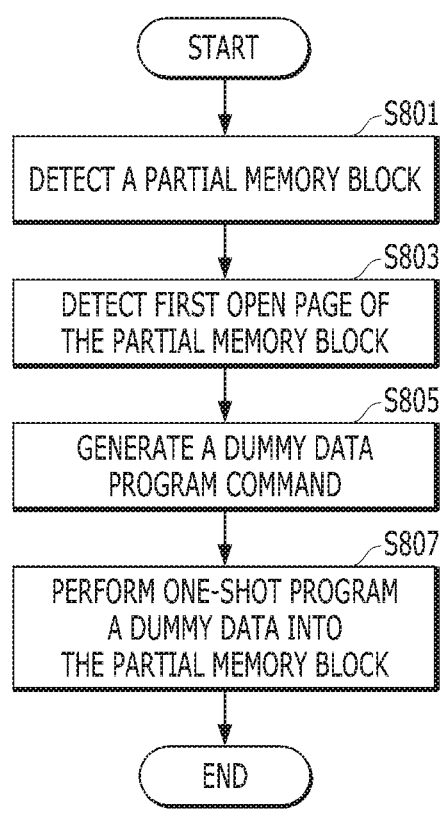
FIG. 8 is a flowchart illustrating an exemplary operating method of the memory system in accordance with an embodiment of the present invention.

FIG. 8 is a flowchart illustrating an exemplary operating method of the memory system described with reference to FIG. 6A.

At step S801, the partial memory block detector 610 may detect a partial memory block among a plurality of memory blocks included in the memory device 150.

At step S803, the open page detector 620 may detect an open page of the partial memory block.

In detail, the open page detector 620 may generate the open page management table having information of a first open page among a plurality of open pages in the partial memory block.

The open page management table may have various information including address and size of the first open page.

The open page detector 620 may identify a number and addresses of the remaining open pages in the partial memory block based on the open page management table.

The open page detector 620 may identify the information of the first open page in the partial memory block from the open page management table. The open page detector 620 may detect the remaining open pages in the partial memory block based on a number and logical and physical addresses of pages included in the partial memory block.

The above description is merely an example of various schemes for identifying all of a plurality of open pages included in a partial memory block by just detecting a first one among the plurality of open pages. The open page detector 620 may identify all of a plurality of open pages included in a partial memory block according to a scheme appropriate to implementation of a memory system.

At step S805, the controller 130 may generate one or more dummy data program commands as many as the number of open pages according to the operations of the partial memory block detector 610 and the open page detector 620. The dummy data program commands may be implemented as a single one-shot program command.

At step S807, the controller 130 may control the memory device 150 to perform a one-shot program operation with dummy data in response to a single one-shot program command. That is, the controller 130 may control the memory device 150 to perform a one-shot program operation with dummy data to the first to last open pages in a partial memory block in response to a single one-shot program command.

Figure 9:
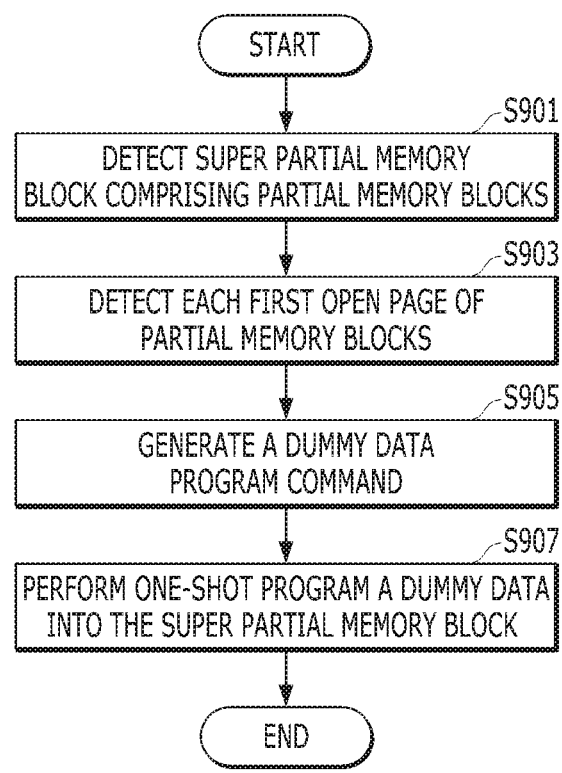
FIG. 9 is a flowchart illustrating an exemplary operating method of the memory system in accordance with an embodiment of the present invention.

FIG. 9 is a flowchart illustrating an exemplary operating method of the memory system described with reference to FIG. 7A.

At step S901, the partial memory block detector 710 may detect partial memory blocks among a plurality of memory blocks included in the memory device 150. When the memory device 150 includes the first memory block 730 and the third memory block 750 as the plurality of partial memory blocks, the controller 130 may manage the plurality of partial memory blocks 730, 750 as a super partial memory block.

At step S903, the open page detector 620 may detect first open pages of the plurality of partial memory blocks, respectively.

At step S905, the controller 130 may generate one or more dummy data program commands as many as the number of open pages according to the operations of the partial memory block detector 710 and the open page detector 720. The dummy data program commands may be implemented as a single one-shot program command.

In detail, the controller 130 may generate a single one-shot program command corresponding to the super partial memory block.

At step S907, the controller 130 may control the memory device 150 to perform a one-shot program operation with dummy data in response to a single one-shot program command.

That is, the controller 130 may control the memory device 150 to perform a one-shot program operation with dummy data to the first to last open pages (e.g., the fifth to eighth pages 735 to 738) in the first memory block 730 detected as a partial memory block and the first to last open pages (e.g., the fourth to eighth pages 754 to 758) in the third memory block 750 detected as a partial memory block in response to a single one-shot program command.

As described above, operation performance of a memory system may be improved or enhanced by reducing or minimizing process, required to identify an amount of dummy data to be programmed, through a one-shot program operation with dummy data.

FIGS. 10 to 18 are diagrams schematically illustrating application examples of the data processing system of FIGS. 1 to 9, in accordance with various embodiments.

Figure 10:
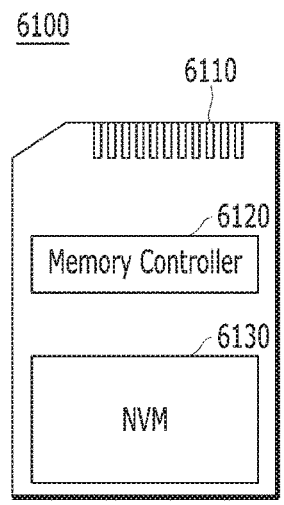
FIGS. 10 to 18 are diagrams schematically illustrating application examples of a data processing system, in accordance with various embodiments of the present invention.

FIG. 10 is a diagram schematically illustrating an example of the data processing system including the memory system in accordance with the embodiment. FIG. 10 schematically illustrates a memory card system to which the memory system in accordance with the embodiment is applied.

Referring to FIG. 10, the memory card system 6100 may include a memory controller 6120, a memory device 6130, and a connector 6110.

More specifically, the memory controller 6120, configured to access the memory device 6130, may be electrically connected to the memory device 6130 embodied by a nonvolatile memory. For example, the memory controller 6120 may be configured to control read, write, erase and background operations of the memory device 6130. The memory controller 6120 may be configured to provide an interface between the memory device 6130 and a host, and to use a firmware for controlling the memory device 6130. That is, the memory controller 6120 may correspond to the controller 130 of the memory system 110 described with reference to FIGS. 1 to 9, while the memory device 6130 may correspond to the memory device 150 of the memory system 110 described with reference to FIGS. 1 to 9.

Thus, the memory controller 6120 may include a RAM, a processing unit, a host interface, a memory interface and an error correction unit. The memory controller 130 may further include the elements described in FIG. 1.

The memory controller 6120 may communicate with an external device, for example, the host 102 of FIG. 1 through the connector 6110. By way of example but not limitation, as described with reference to FIG. 1, the memory controller 6120 may be configured to communicate with an external device under one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Fire ire, universal flash storage (UFS), WIFI and Bluetooth. Thus, the memory system and the data processing system in accordance with the present embodiment may be applied to wired/wireless electronic devices or specific mobile electronic devices.

The memory device 6130 may be implemented by a nonvolatile memory. By the way of example but not limitation, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC) and a universal flash storage (UFS).

Figure 11:
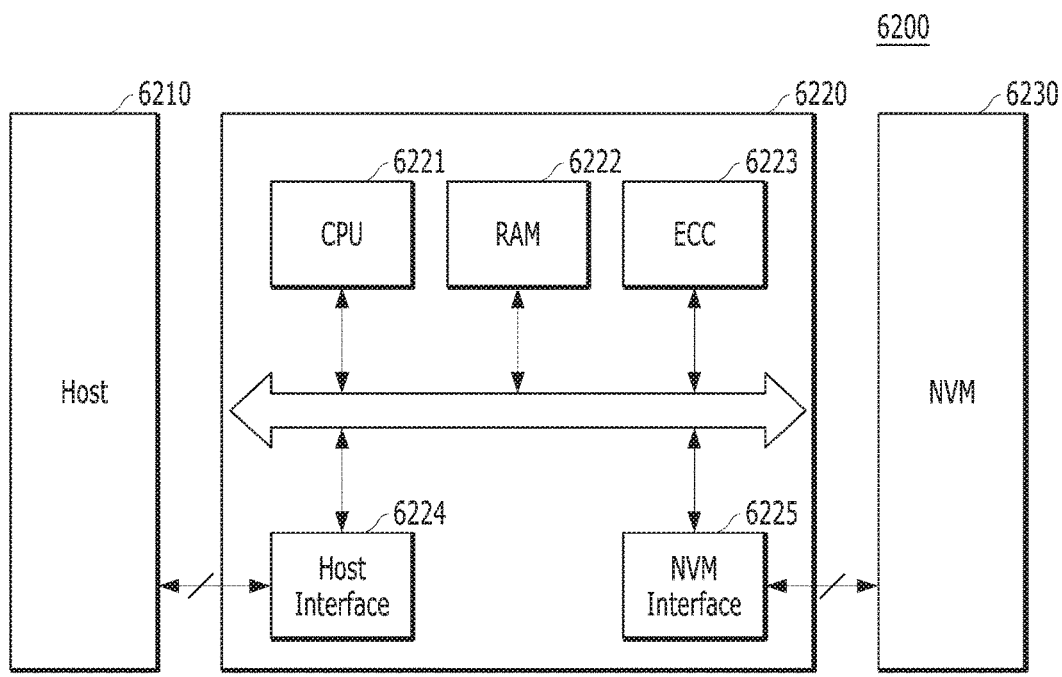

FIG. 11 is a diagram schematically illustrating an example of the data processing system including a memory system, in accordance with the present embodiment.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (a CF, a SD, a micro-SD or the like) or USB device, as described with reference to FIG. 1. The memory device 6230 may correspond to the memory device 150 in the memory system 110 described in FIGS. 1 to 9. The memory controller 6220 may correspond to the controller 130 in the memory system 110 described in FIGS. 1 to 9.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may carry out a wireless communication function with a mobile communication protocol such as WiFi or Long Term Evolution (LTE). The memory controller 6220 may be connected to an external device, for example, the host 6210 or another external device, and then transmit/receive data to/from the external device. As the memory controller 6220 is configured to communicate with the external device through one or more of various communication protocols, the memory system and the data processing system in accordance with the present embodiment may be applied to wired/wireless electronic devices or particularly a mobile electronic device.

Figure 12:
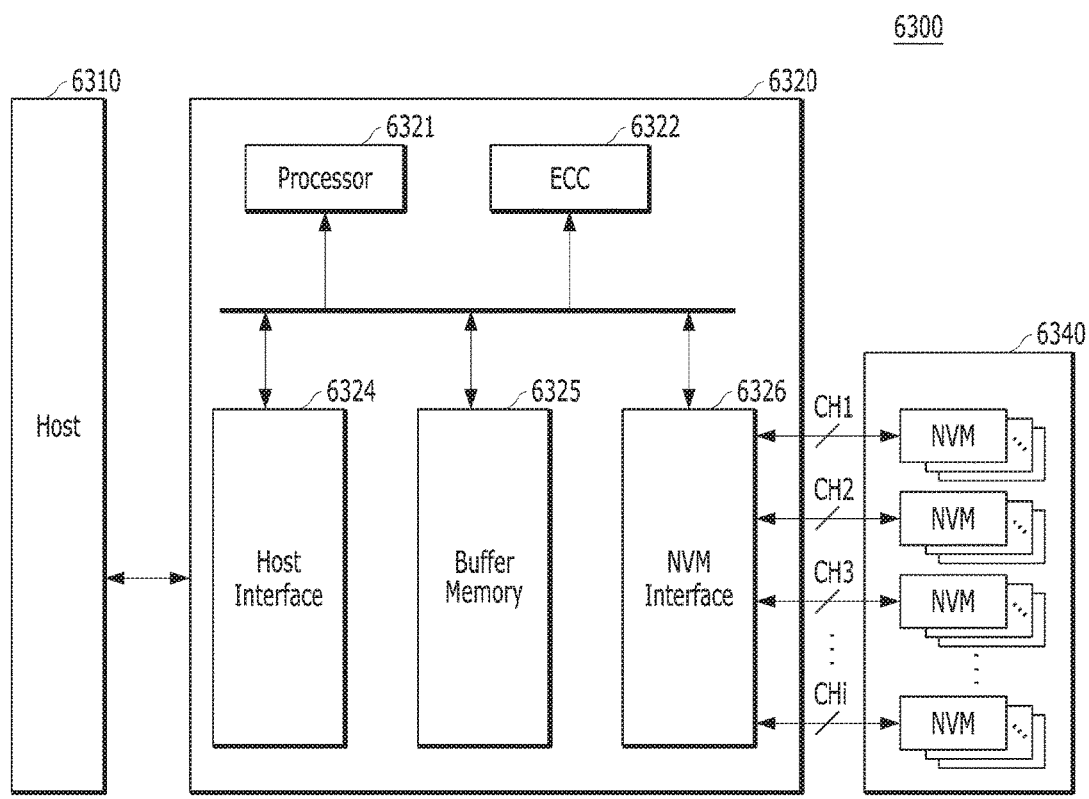

FIG. 12 is a diagram schematically illustrating an example of the data processing system including the memory system in accordance with the present embodiment. FIG. 12 schematically illustrates an SSD to which the memory system in accordance with the present embodiment is applied.

Referring to FIG. 12, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or Further, the buffer memory 6325 may temporarily store meta data of the plurality of flash memories NVM, for example, map data including a mapping table. The buffer memory 6325 may be embodied by volatile memories such as a DRAM, a SDRAM, a DDR SDRAM, a LPDDR SDRAM and a GRAM or nonvolatile memories such as a FRAM, a ReRAM, a STT-MRAM and a PRAM. For convenience of description, FIG. 12 illustrates that the buffer memory 6325 exists in the controller 6320. However, the buffer memory 6325 may locate outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, to output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, to output data read from the selected SSDs 6300 to the host 6310.

Figure 13:
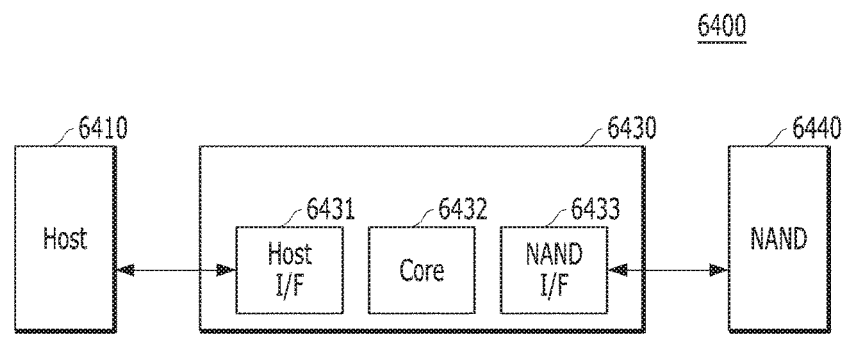
Figure 14:
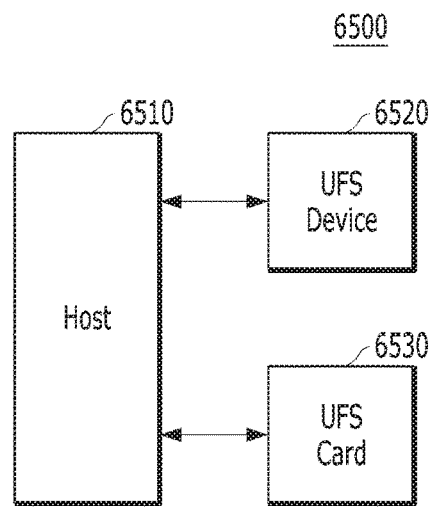
Figure 15:
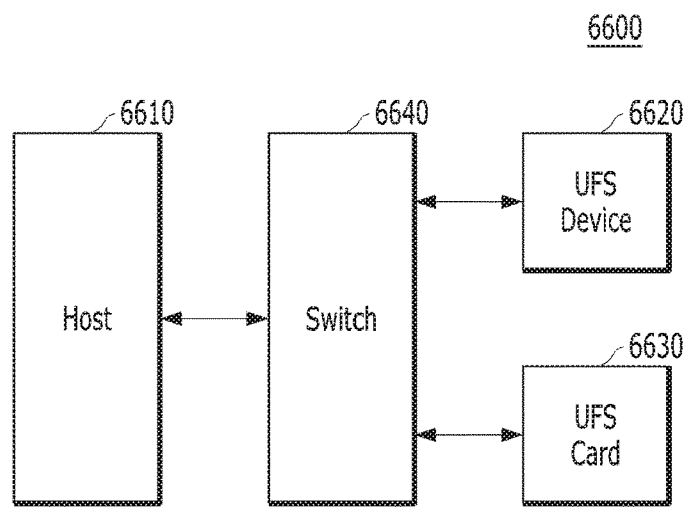
Figure 16:
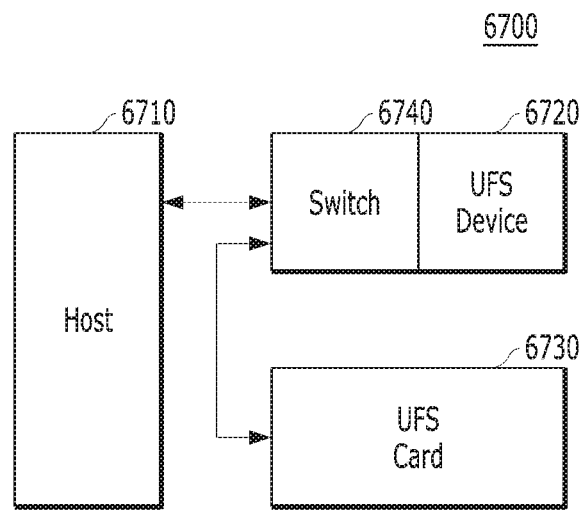
Figure 17:
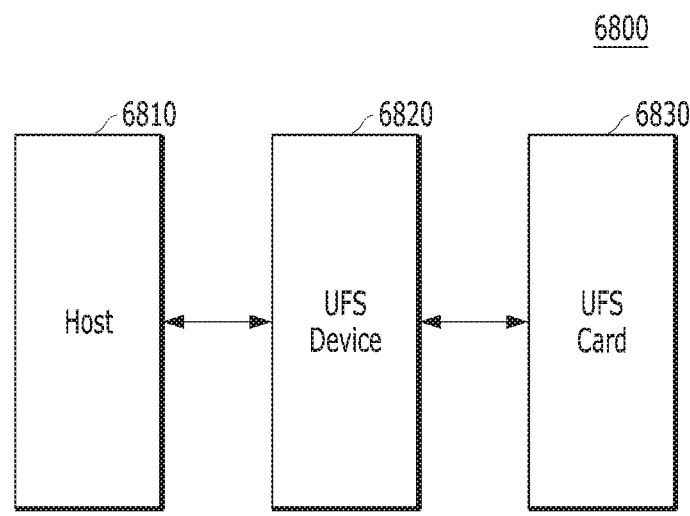

FIG. 13 is a diagram schematically illustrating an example of the data processing system including the memory system in accordance with an embodiment. FIG. 13 schematically illustrates an embedded Multi-Media Card (eMMC) to which the memory system in accordance with an embodiment is applied.

Referring to FIG. 13, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control the operations of the eMMC 6400, the host interface 6431 may provide an interface function between the controller 6430 and the host 6410. The NAND interface 6433 may provide an interface function between the memory device 6440 and the controller 6430. By the way of example but not limitation, the host interface 6431 may serve as a parallel interface such as a MMC interface as described with reference to FIG. 1. Furthermore, the host interface 6431 may serve as a serial interface, for example, UHS ((Ultra High Speed)-I/UHS-II) interface.

FIGS. 14 to 17 are diagrams schematically illustrating other examples of the data processing system including the memory system in accordance with an embodiment. FIGS. 14 to 17 schematically illustrate UFS (Universal Flash Storage) systems to which the memory system in accordance with an embodiment is applied.

Referring to FIGS. 14 to 17, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices or particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices or particularly mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 11 to 13, and the UFS cards 6530, 6630, 6730, 6830 may be embodied in the form of the memory card system 6100 described with reference to FIG. 10.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, for example, a UFDs, a MMC, a SD, a mini-SD, and a micro-SD.

Figure 18:
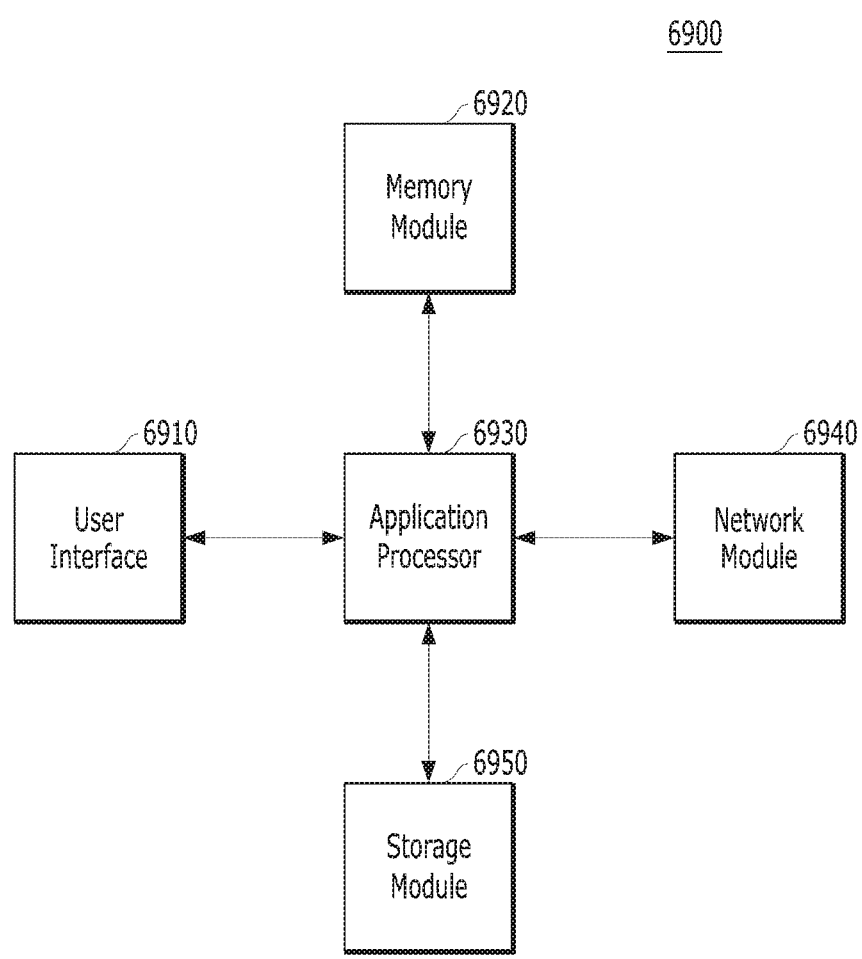

FIG. 18 is a diagram schematically illustrating another example of the data processing system including the memory system in accordance with an embodiment. FIG. 18 is a diagram schematically illustrating a user system to which the memory system in accordance with an embodiment is applied.

Referring to FIG. 18, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile RAM such as a DRAM, a SDRAM, a DDR SDRAM, a DDR2 SDRAM, a DDR3 SDRAM, a LPDDR SDRAM, a LPDDR3 SDRAM or a LPDDR3 SDRAM or a nonvolatile RAM such as a PRAM, a ReRAM, a MRAM or a FRAM. For example, the application processor 6930 and the memory module 6920 may be packaged and mounted, based on POP (Package on Package).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and a UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as defined in the following claims.

What is claimed is:

1. A semiconductor memory system comprising:
a memory device including a plurality of memory blocks;
a partial memory block detector suitable for detecting at least one partial memory block including a plurality of open pages among the plurality of memory blocks;
an open page detector suitable for detecting addresses and a number of the plurality of open pages among a plurality of pages included in the partial memory block; and
a controller suitable for controlling the memory device to perform a one-shot program operation with dummy data on the plurality of open pages according to the addresses and the number of the plurality of open pages,
wherein each of the open pages is a page which is not programed or not completely programed.

2. The semiconductor memory system of claim 1, wherein the partial memory block detector detects a memory block including the plurality of open pages as a partial memory block among the plurality of memory blocks.

3. The semiconductor memory system of claim 1, wherein the controller controls the memory device to perform the one-shot program operation with dummy data through a single one-shot program command.

4. The semiconductor memory system of claim 1, wherein the open page detector generates an open page management table including information of a first open page among the plurality of open pages included in the partial memory block.

5. The semiconductor memory system of claim 4, wherein the open page management table has information of:
an address of the first open page; and
a size of the first open page.

6. The semiconductor memory system of claim 4, wherein the open page detector calculates the addresses and the number of the plurality of open pages based on the open page management table.

7. The semiconductor memory system of claim 4, wherein the controller controls the memory device to perform the one-shot program operation with dummy data on the plurality of open pages from first to last open pages.

8. The semiconductor memory system of claim 2, wherein the controller manages, when the partial memory block detector detects a plurality of partial memory blocks among the plurality of memory blocks, the plurality of partial memory blocks as a super partial memory block.

9. The semiconductor memory system of claim 8, wherein the open page detector detects addresses and a number of a plurality of open pages among a plurality of pages included in each of the plurality of partial memory blocks.

10. The semiconductor memory system of claim 9, wherein the controller controls the memory device to perform the one-shot program operation with dummy data on the super partial memory block.

11. An operating method of a semiconductor memory system including a memory device having a plurality of memory blocks and a controller, the method comprising:
a first step of detecting at least one partial memory block having a plurality of open pages among the plurality of memory blocks;
a second step of detecting addresses and a number of a plurality of open pages among a plurality of pages included in the partial memory block; and
a third step of performing a one-shot program operation on the plurality of open pages with dummy data according to the addresses and the number of the plurality of open pages,
wherein each of the open pages is a page which is not programed or not completely programed.

12. The method of claim 11, wherein the first step detects a memory block including the plurality of open pages as a partial memory block among the plurality of memory blocks.

13. The method of claim 11, wherein the third step performs the one-shot program operation with dummy data through a single one-shot program command.

14. The method of claim 11, wherein the second step generates an open page management table including information of a first open page among the plurality of open pages included in the partial memory block.

15. The method of claim 14, wherein the open page management table has information of:
    an address of the first open page; and
    a size of the first open page.

16. The method of claim 14, wherein the second step calculates the addresses and the number of the plurality of open pages based on the open page management table.

17. The method of claim 14, wherein the third step performs the one-shot program operation with dummy data on the plurality of open pages from first to last open pages.

18. The method of claim 12, wherein the third step manages, when the first step detects a plurality of partial memory blocks among the plurality of memory blocks, the plurality of partial memory blocks as a super partial memory block.

19. The method of claim 18, wherein the second step detects addresses and a number of a plurality of open pages among a plurality of pages included in each of the plurality of partial memory blocks.

20. The method of claim 19, wherein the third step performs the one-shot program operation with dummy data on the super partial memory block.

* * * * *